(12) United States Patent
Dey et al.

(10) Patent No.: US 9,176,522 B1
(45) Date of Patent: Nov. 3, 2015

(54) DUAL-EDGE GATED CLOCK SIGNAL GENERATOR

(71) Applicants: Amit Kumar Dey, Noida (IN); Himanshu Mangal, Agra (IN); Kulbhushan Misri, Gurgaon (IN); Amit Roy, Noida (IN); Vijay Tayal, Noida (IN); Chetan Verma, Noida (IN)

(72) Inventors: Amit Kumar Dey, Noida (IN); Himanshu Mangal, Agra (IN); Kulbhushan Misri, Gurgaon (IN); Amit Roy, Noida (IN); Vijay Tayal, Noida (IN); Chetan Verma, Noida (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 15 days.

(21) Appl. No.: 14/267,933

(22) Filed: May 2, 2014

(51) Int. Cl.
*G06F 1/04* (2006.01)
*H03K 3/00* (2006.01)
*H03K 19/20* (2006.01)

(52) U.S. Cl.
CPC . *G06F 1/04* (2013.01); *H03K 19/20* (2013.01)

(58) Field of Classification Search
CPC .......................................................... G06F 1/04
USPC ................................................. 327/399, 291
See application file for complete search history.

(56) References Cited

U.S. PATENT DOCUMENTS

| | | | |
|---|---|---|---|
| 6,301,322 B1* | 10/2001 | Manning | 377/54 |
| 6,348,825 B1* | 2/2002 | Galbi et al. | 327/218 |
| 7,109,776 B2* | 9/2006 | Tschanz et al. | 327/298 |
| 7,652,516 B2* | 1/2010 | Bourstein et al. | 327/291 |
| 7,902,878 B2 | 3/2011 | Saint-Laurent et al. | |
| 8,058,900 B1* | 11/2011 | Rosen | 326/40 |
| 8,384,437 B2* | 2/2013 | Sofer et al. | 326/93 |
| 8,493,121 B1* | 7/2013 | Ramaraju | 327/203 |
| 2003/0151433 A1* | 8/2003 | Takai | 327/158 |
| 2006/0061400 A1* | 3/2006 | Tschanz et al. | 327/291 |
| 2008/0074151 A1* | 3/2008 | Kim | 326/94 |
| 2011/0133806 A1* | 6/2011 | Subramani et al. | 327/215 |

\* cited by examiner

*Primary Examiner* — Ryan Jager
(74) *Attorney, Agent, or Firm* — Charles Bergere (57) ABSTRACT

A clock signal generator provides a gated clock signal GCLK to trigger operation of dual-edge triggered circuits. A first detector generates, while a clock gating signal /EN is asserted, a first detector output signal that is asserted or de-asserted as a function of disjunction or conjunction respectively of the values that an input clock signal CLK and the gated clock signal GCLK had when the clock gating signal /EN transitioned. A second detector generates, while the clock gating signal /EN is de-asserted, as the value of the gated clock signal GCLK, the value CLK or its complement /CLK as a function of the first detector output signal. When the clock gating signal /EN is asserted, the second detector maintains the value that the gated clock signal GCLK had when the clock gating signal /EN transitioned from de-asserted to asserted.

15 Claims, 4 Drawing Sheets

DUAL-EDGE GATED CLOCK SIGNAL GENERATOR

BACKGROUND OF THE INVENTION

The present invention is directed to a clock signal generator for an integrated circuit and, more particularly, to a gated clock signal generator for use with dual-edge triggered circuits.

Conventional clocked circuits, such as flip flops or edge triggered gates, are triggered by a single edge of the clock signal. The triggering edge of the clock signal may be either the positive or negative edge, more generally the asserting or de-asserting edge. However, clocked circuits can alternatively be triggered by both clock signal edges (asserting and de-asserting). The clocking rate for dual-edge triggered circuits is nearly double the clocking rate for a conventional single-edge triggered circuit clocked by the same clock signal.

Power consumed by the clock trees, which is a function of clock frequency, is a substantial proportion of the total power of certain integrated circuits (ICs), even as high as 40% in some cases. The power consumed by the clock trees can be maintained for faster clocking rates of the dual-edge clocked circuits, or can be reduced for similar clocking rates when the clocked circuits are triggered by both edges. Savings can also be achieved in the clocked circuits themselves compared to equivalent single edge triggered modules.

An issue arises with gating the clock signals for dual-edge triggered circuits. If a conventional gated single-edge clock signal generator is used with dual-edge triggered circuits, functional limitations appear. For example, a transition of the gate signal risks resulting in loss of clock signal edges, or in additional, unwanted clock signal edges. Efforts made to avoid these risks may lead to undue complication of the dual-edge clock signal generator with consequent additional cost and operational difficulties.

BRIEF DESCRIPTION OF THE DRAWINGS

The present invention, together with objects and advantages thereof, may best be understood by reference to the following description of embodiments thereof shown in the accompanying drawings. Elements in the drawings are illustrated for simplicity and clarity and have not necessarily been drawn to scale.

DETAILED DESCRIPTION

Figure 1:
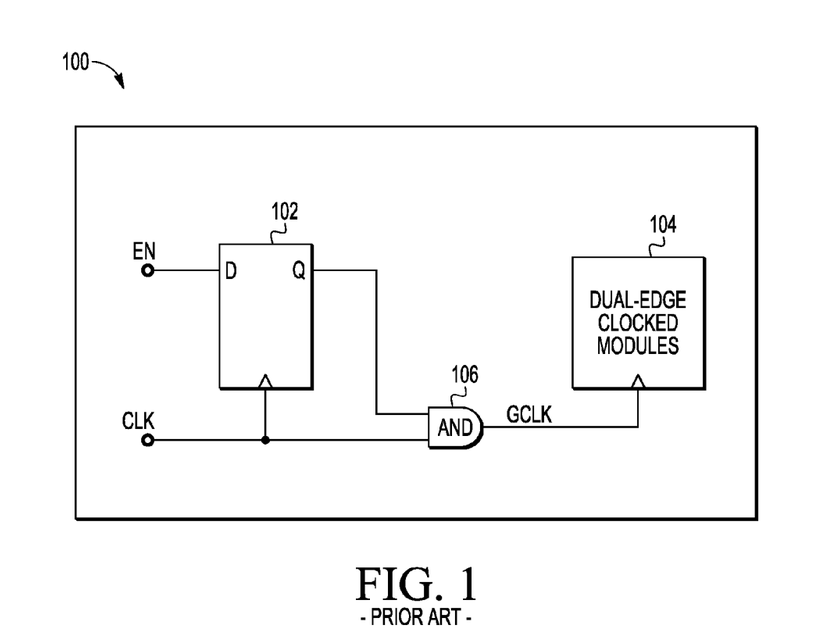
FIG. 1 is a schematic block diagram of a semiconductor device including dual-edge triggered modules clocked by a clock signal from a conventional single-edge clock gating circuit.

FIG. 1 shows a semiconductor device 100 having a conventional single-edge clock gating circuit. The clock gating circuit includes a negative level triggered latch 102 that receives an input clock signal CLK at its clock terminal and a low active gating signal EN at its data input terminal D. The data output Q of the negative level triggered latch 102 corresponds with the value of the gating signal EN when the input clock signal CLK is low. A gated clock signal GCLK for dual-edge triggered circuit modules 104 is generated by an AND gate 106 that receives the input clock signal CLK on one input and the data output Q of the negative level triggered latch 102 on its other input. The output clock signal GCLK is high when the gating signal EN (illustrated in FIG. 2) and the clock signal CLK are high, and is low when the gating signal EN (or the clock signal CLK) is low. That is, when the gating signal EN and the data output Q of the latch 102 are high, the gated clock signal GCLK takes the value of the clock signal CLK. When the gating signal EN is low (and active), the output of the AND gate 106 is gated, and its output GCLK is low.

Figure 2:
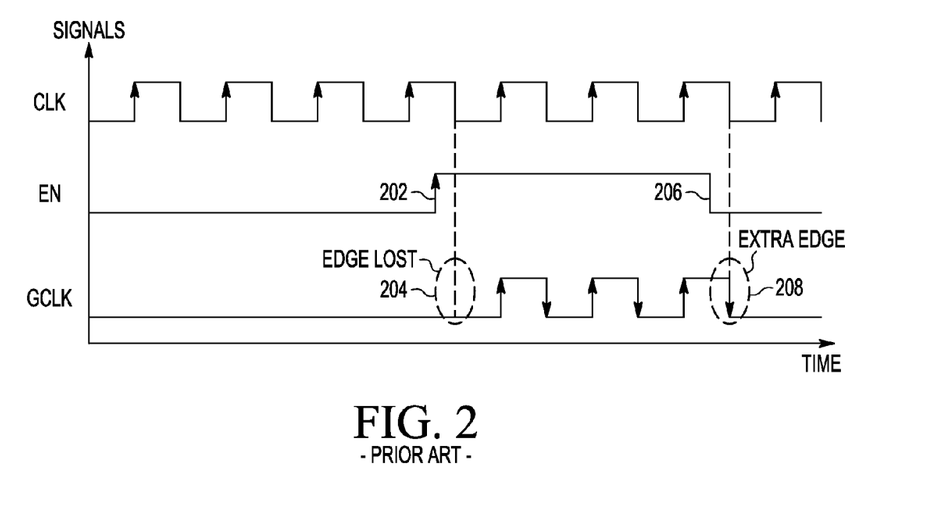
FIG. 2 is a graph showing variation with time of signals appearing in operation of the semiconductor device of FIG. 1.

FIG. 2 illustrates the change with time of signals appearing in operation of the clock gating circuit of the semiconductor device 100. If the low active gating signal EN goes high just before a negative edge of the input clock signal CLK, a transition in the gated clock signal GCLK may be missed as shown at 204. If the gating signal EN goes low just before a negative edge of the input clock signal CLK, an extra unwanted transition in the gated clock signal GCLK may occur at the next transition of the clock signal CLK as shown at 208. Conventional approaches to avoiding missing transitions of the gated clock signal GCLK and eliminating extra, unwanted transitions in the gated clock signal GCLK may be complex and costly.

FIGS. 3 to 6 illustrate a clock signal generator 300, a semiconductor device 302 comprising dual-edge triggered modules 104 and the clock signal generator 300, and a method 500 of generating a gated clock signal, respectively, in accordance with embodiments of the present invention. The clock signal generator 300 and the method 500 provide a gated clock signal GCLK used to trigger operation of the dual-edge triggered circuit modules 104. The clock signal generator 300 generates the clock signal GCLK when an active-high clock gating signal /EN is low (de-asserted) and a complementary clock gating signal EN is high, and blocks the gated clock signal GCLK when the clock gating signal /EN is high (asserted) and the complementary clock gating signal EN is low. It will be appreciated that the clock signal generator 300 could be adapted to operation with a low active clock gating signal /EN, as illustrated in FIGS. 1 and 2.

Figure 6:
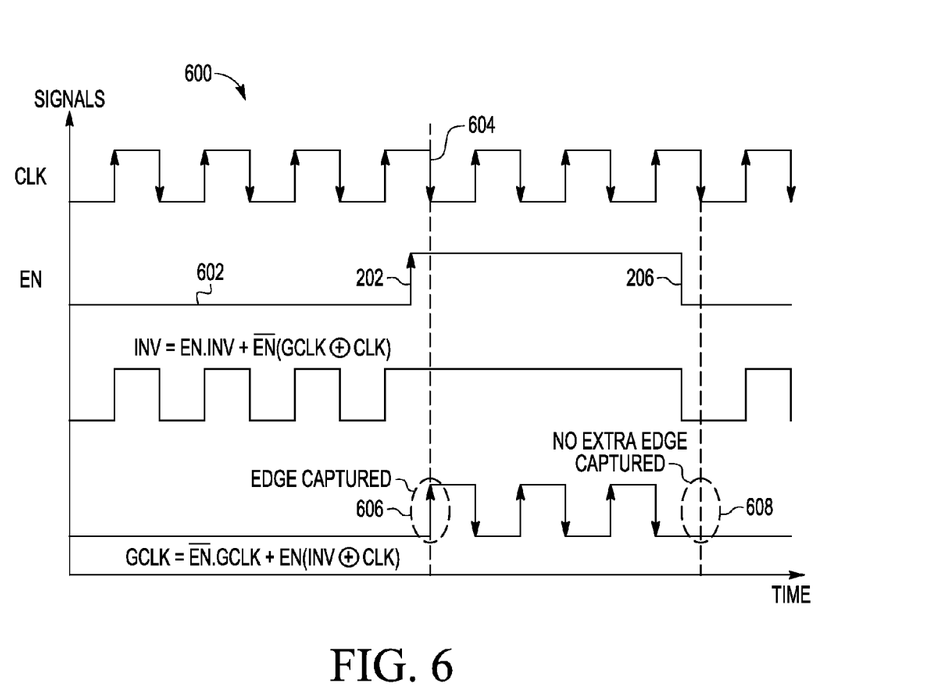
FIG. 6 is a graph showing variation with time of signals appearing in operation of the clock signal generator of FIGS. 3 and 4 and the method of FIG. 5.

The clock signal generator 300 illustrated in FIGS. 3 and 4 comprises a first detector 304 that receives the input clock signal CLK, the clock gating signal /EN and a feedback signal of the gated clock signal GCLK (output by the second detector 306, described below). The first detector 304 generates, while the clock gating signal /EN is high (asserted) (from 202 until 206 in FIG. 6—note that FIG. 6 shows EN, not /EN), a first detector output signal INV that is asserted or de-asserted as a function of disjunction or conjunction respectively of the values that the input clock signal CLK and the gated clock signal GCLK had when the clock gating signal /EN transitioned from high to low (asserted to de-asserted) at 202. The clock signal generator 300 also comprises a second detector 306 that receives the input clock signal CLK, the clock gating signal /EN and the first detector output signal INV. The second detector 306 generates, while the clock gating signal /EN is low (de-asserted), as the value of the gated clock signal GCLK the value of the input clock signal CLK or the complementary value /CLK as a function of the first detector output signal INV. The second detector 306 maintains, while the clock gating signal /EN is high (asserted), the value that the gated clock signal GCLK had when the clock gating signal /EN transitioned from low to high (de-asserted to asserted).

The second detector 306 selects as the value of the gated clock signal GCLK, the value of the input clock signal CLK if the first detector output signal INV is low, and the value of the complement of the input clock signal /CLK if the first detector output signal INV is high (as shown in FIG. 6). The first and second detectors 304 and 306 may comprise first and second asymmetric Muller C-elements respectively.

Figure 4:
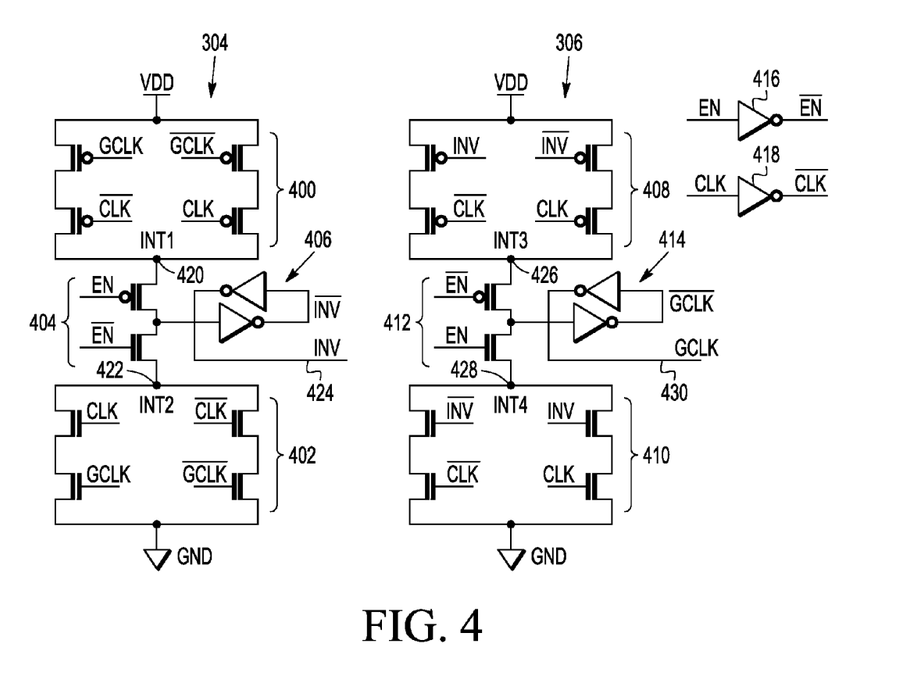
FIG. 4 is a schematic circuit diagram of an embodiment of the clock signal generator of FIG. 3.

Referring to FIG. 4, the first detector 304 may comprise a first logic gate 400 that generates a first intermediate signal INT1 that is high (asserted) in the case of disjunction of the values of the input clock signal CLK and the gated clock signal GCLK, a second logic gate 402 that generates a second intermediate signal INT2 that is low (de-asserted) in the case of conjunction of the values of the input clock signal CLK and the gated clock signal GCLK, a first selector 404 for passing the first or second intermediate signal INT1 or INT2 to the second detector 306 as the first detector output signal INV when the clock gating signal /EN is high (asserted), and a first latch 406 for maintaining the value the first detector output signal INV had when the clock gating signal /EN transitioned from high to low (asserted to de-asserted). The first and second logic gates 400 and 402 of the first detector 304 may comprise respectively XOR and XNOR gates that receive the input clock signal CLK and the gated clock signal GCLK and the complement /CLK of the input clock signal CLK and a complement /GCLK of the gated clock signal GCLK.

The second detector 306 may comprise a third logic gate 408 that generates a third intermediate signal INT3 that is high (asserted) in the case of disjunction of the values of the input clock signal CLK and the first detector output signal INV, a fourth logic gate 410 that generates a fourth intermediate signal INT4 that is low (de-asserted) in the case of conjunction of the values of the input clock signal CLK and the first detector output signal INV, a second selector 412 for passing the third or fourth intermediate signal INT3 or INT4 as the value of the gated clock signal GCLK when the clock gating signal /EN is low (de-asserted), and a second latch 414 for maintaining the value the second detector output signal GCLK had when the clock gating signal /EN transitioned from low to high (de-asserted to asserted).

Figure 5:
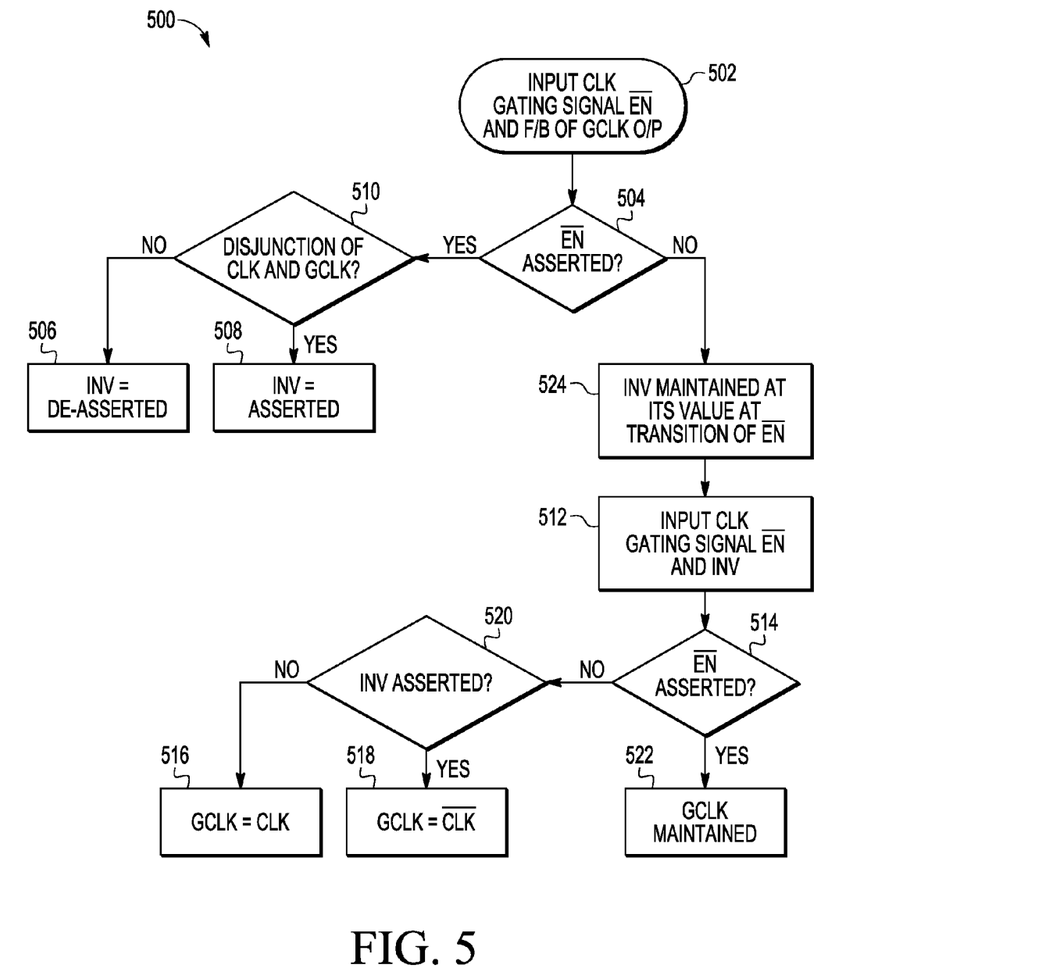
FIG. 5 is a flow chart of a method of generating a gated clock signal for use with dual-edge triggered circuit modules in accordance with an embodiment of the present invention.

An example of the method 500 of generating a gated clock signal is illustrated in FIG. 5. The method 500 comprises receiving at 502 the input clock signal CLK, the clock gating signal /EN and the gated clock signal GCLK (provided as a feedback signal). While the clock gating signal /EN is high (asserted) at 504, the first detector output signal INV is generated that is high (asserted) at 506 or low (de-asserted) at 508 as a function of disjunction or conjunction respectively at 510 of the values of the input clock signal CLK and the gated clock signal GCLK. When the clock gating signal /EN is low (de-asserted) at 504 (from 202 until 206 in FIG. 6), the first detector output signal INV has a value that is asserted or de-asserted as a function of disjunction or conjunction respectively at 510 of the values had when the clock gating signal /EN transitioned from high to low (asserted to de-asserted) at 202 in FIG. 6. At 512, the input clock signal CLK, the clock gating signal GCLK and the first detector output signal INV are received at second detector 306. When the clock gating signal /EN is low (de-asserted) at 514, the value of the gated clock signal GCLK is provided as the value of the input clock signal CLK at 516 or the complementary value /CLK at 518 as a function of the first detector output signal INV at 520. When the clock gating signal /EN is high (asserted) at 514, the value that the gated clock signal GCLK had when the clock gating signal /EN transitioned from low to high (de-asserted to asserted) is maintained at 522. When the clock gating signal /EN is low (de-asserted) at 504, the value that the first detector output signal INV had when the clock gating signal transitioned from high to low (asserted to de-asserted) is maintained at 524.

The embodiments of the invention illustrated in FIGS. 3 to 6 enable missing transitions of the output clock signal GCLK to be avoided and extra unwanted transitions in the output clock signal GCLK to be eliminated. The complexity and cost of the gated clock signal generator can be substantially reduced compared to conventional approaches to such issues.

Figure 3:
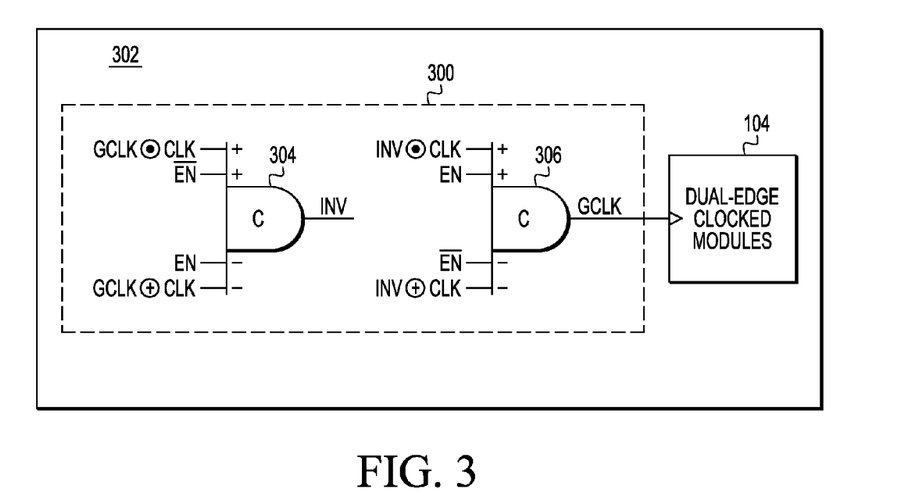
FIG. 3 is a schematic block diagram of a semiconductor device including dual-edge clocked modules and a clock signal generator for generating a gated clock signal for use with the dual-edge triggered circuits in accordance with an embodiment of the present invention.

In FIGS. 3 and 4, the first and second detectors 304 and 306 are asymmetric Muller C-elements. Typically, the output of an asymmetric Muller C-element maintains its value in the absence of specific transitions in its inputs. The inputs referred to as 'plus' must all be high (asserted) for the output to transition from high to low (asserted to de-asserted). Conversely, the inputs referred to as 'minus' must all be low (de-asserted) for the output to transition from low to high (de-asserted to asserted).

In this example, the first detector 304 receives on its plus inputs the clock gating signal /EN, and the result of an XNOR operation on the input clock signal CLK and the feedback of the gated clock signal GCLK. Its minus inputs receive the complement EN of the clock gating signal /EN, and the result of an XOR operation on the input clock signal CLK and the feedback of the gated clock signal GCLK.

The output INV of the first detector 304 can only change from low to high (de-asserted to asserted) in the case of assertion of the clock gating signal /EN at the same time as disjunction (XOR) of the input clock signal CLK and the gated clock signal GCLK. The output INV can only change from high to low (asserted to de-asserted) in the case of assertion of the clock gating signal /EN at the same time as conjunction (XNOR) of the input clock signal CLK and the gated clock signal GCLK.

The second detector 306 receives on its plus inputs the complement EN of the clock gating signal /EN, and the result of an XNOR operation on the input clock signal CLK and the output INV of the first detector 304. Its minus inputs receive the clock gating signal /EN, and the result of an XOR operation on the input clock signal CLK and the output INV of the first detector 304.

The output of the second detector 306, the gated clock signal GCLK, can only change from low to high (de-asserted to asserted) in the case of de-assertion of the clock gating signal /EN at the same time as disjunction (XOR) of the input clock signal CLK and the output INV of the first detector 304. On the other hand, the gated clock signal GCLK can only change from high to low (asserted to de-asserted) in the case of de-assertion of the clock gating signal /EN at the same time as conjunction (XNOR) of the input clock signal CLK and the output INV of the first detector 304.

Referring again to FIG. 4, examples of transistor-level structures of the asymmetric Muller C-elements of the first and second detectors 304 and 306 are shown. In this embodiment, the circuits are connected to a positive voltage VDD and to ground GND. Inverters 416 and 418 are provided to invert the clock gating signal /EN and the input clock signal CLK, respectively.

The first logic gate 400 of the first detector 304 includes an XOR gate having two parallel paths between the VDD and a node 420, each path having two p-type metal-oxide field-effect transistors (PMOSFETs) in series. In one path, the gated clock signal GCLK is applied to the gate of one MOSFET and the complement /CLK of the input clock signal CLK is applied to the gate of the other MOSFET. In the other path of the gate 400, the complement /GCLK of the gated clock signal GCLK is applied to the gate of one MOSFET and the input clock signal CLK is applied to the gate of the other MOSFET. During disjunction of the values of the gated clock signal GCLK and the input clock signal CLK, both MOSFETs of one or the other of the two paths conduct and assert the first intermediate signal INT1 at the node 420 by pulling the voltage of the node 420 up to the first logic gate 400, otherwise disconnecting the node 420 from VDD.

The second logic gate 402 of the first detector 304 includes an XNOR gate having two parallel paths between ground GND and a node 422, each path having two n-type MOSFETs in series. In one path, the gated clock signal GCLK is applied to the gate of one MOSFET and the input clock signal CLK is applied to the gate of the other MOSFET. In the other path of the gate 402, the complement /GCLK of the gated clock signal GCLK is applied to the gate of one MOSFET and the complement /CLK of the input clock signal CLK is applied to the gate of the other MOSFET. During conjunction of the values of the gated clock signal GCLK and the input clock signal CLK, both MOSFETs of one or the other of the two paths conduct and de-assert the second intermediate signal INT2 at the node 422, by pulling the voltage of the node 420 to GND, the second logic gate 402 otherwise disconnects the node 422 from GND.

The first selector 404 of the first detector 304 has a first PMOSFET connected between the node 420 and an output node 424 of the first detector 304 and a second NMOSFET connected between the node 422 and the output node 424. The complement EN of the clock gating signal /EN is applied to the gate of the first MOSFET of the first selector 404, and the clock gating signal /EN is applied to the gate of the second MOSFET. The first latch 406 has two inverters connected head-to-tail, one inverter having its input connected to the output node 424 and the other having its input connected to the output of the first inverter and its output connected to the output node 424. When the clock gating signal /EN is high (asserted), and its complement EN is low (de-asserted), the first selector 404 connects the nodes 420 and 422 to the output node 424, and that one of the first or second intermediate signals INT1 or INT2 at the nodes 420 or 422 that is active imposes its value as the first detector output signal INV. When the clock gating signal /EN is low (de-asserted), and its complement EN is high (asserted), the first selector 404 disconnects the nodes 420 and 422 from the output node 424, and the first latch 406 maintains the value the first detector output signal INV had when the clock gating signal /EN transitioned from high to low (asserted to de-asserted).

The second detector 306 has the third logic gate 408 that includes an XOR gate having two parallel paths between VDD and a node 426, each path having two PMOSFETs in series. In one path, the first detector output signal INV is applied to the gate of one MOSFET and the complement /CLK of the input clock signal CLK is applied to the gate of the other MOSFET. In the other path of the third logic gate 408, the complement /INV of the first detector output signal INV is applied to the gate of one MOSFET and the input clock signal CLK is applied to the gate of the other MOSFET. During disjunction of the values of the first detector output signal INV and the input clock signal CLK, both MOSFETs of one or the other of the two paths conduct and assert the third intermediate signal INT3 at the node 426, by pulling the voltage of the node 426 up to VDD, the third logic gate 408 otherwise disconnecting the node 426 from VDD.

The second detector 306 also has the fourth logic gate 410 that includes an XNOR gate having two parallel paths between ground GND and a node 428, each path having two NMOSFETs in series. In one path, the complement /INV of the first detector output signal INV is applied to the gate of one MOSFET and the complement /CLK of the input clock signal CLK is applied to the gate of the other MOSFET. In the other path of the gate 410, the first detector output signal INV is applied to the gate of one MOSFET and the input clock signal CLK is applied to the gate of the other MOSFET. During conjunction of the values of the first detector output signal INV and the input clock signal CLK, both MOSFETs of one or the other of the two paths conducts and de-asserts the fourth intermediate signal INT4 at the node 428, by pulling the voltage of the node 428 to GND, the fourth logic gate 410 otherwise disconnects the node 428 from GND.

The second selector 412 of the second detector 306 has a first PMOSFET connected between the node 426 and an output node 430 of the second detector 306 and a second NMOSFET connected between the node 428 and the output node 430. The clock gating signal /EN is applied to the gate of the first MOSFET of the second selector 412, and the complement EN of the clock gating signal /EN is applied to the gate of its second MOSFET. The second latch 414 has two inverters connected head-to-tail, one inverter having its input connected to the output node 430 and the other having its input connected to the output of the first inverter and its output connected to the output node 430. When the clock gating signal /EN is low (de-asserted), and its complement EN is high (asserted), the second selector 412 connects the nodes 426 and 428 to the output node 430, and that one of the first or second intermediate signals INT3 or INT4 at the nodes 426 or 428 that is active imposes its value as the value of the gated clock signal GCLK. When the clock gating signal /EN is high (asserted), and its complement EN is low (de-asserted), the second selector 412 disconnects the nodes 426 and 428 from the output node 430, and the second latch 414 maintains the value the gated clock signal GCLK had when the clock gating signal /EN transitioned from low to high (de-asserted to asserted).

FIG. 6 is a graph 600 against time of signals appearing in operation of the clock signal generator 300 of FIGS. 3 and 4, which illustrate how this embodiment of the invention solve the issues illustrated with reference to FIG. 2. While the gating signal /EN is high (asserted, and its complement EN shown in FIG. 6 is de-asserted) at 602, the first detector output signal INV is alternately asserted and de-asserted with disjunction and conjunction respectively of the values of the input clock signal CLK and the gated clock signal GCLK. When the clock gating signal /EN is de-asserted just before a transition of the clock signal CLK while the gated clock signal GCLK is still maintained at a value different from the value of the clock signal CLK as shown at 202, the first detector output signal INV is maintained at the value it had at 202 when the clock gating signal /EN transitioned from high to low (asserted to de-asserted).

When the clock gating signal /EN is low (de-asserted), the value of the gated clock signal GCLK is selected to be the complement /CLK of the input clock signal CLK if the first detector output signal INV is asserted (disjunction of CLK and GCLK), as shown in FIG. 6, or conversely to be the value of the input clock signal CLK if the first detector output signal INV goes low (is de-asserted). Accordingly, at the next edge

604 of the input clock signal CLK the gated clock signal GCLK transitions at 606 and no edge of the gated clock signal GCLK is missed.

When the gating signal /EN is asserted at 206 just before a transition of the input clock signal CLK while the gated clock signal GCLK is at the complementary value to the value of the clock signal CLK as shown at 608, the first detector output signal INV transitions immediately. While the clock gating signal /EN is asserted, the gated clock signal GCLK is then maintained at the value it had when the clock gating signal /EN transitioned from de-asserted to asserted. Accordingly, no extra unwanted transition occurs in the gated clock signal GCLK.

The invention may also be implemented at least partially in a non-transitory machine-readable medium containing a computer program for running on a computer system, the program at least including code portions for performing steps of a method according to the invention when run on a programmable apparatus, such as a computer system or enabling a programmable apparatus to perform functions of a device or system according to the invention.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice-versa. Also, a plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The terms "assert" or "set" and "negate" (or "de-assert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. Similarly, any arrangement of components to achieve the same functionality is effectively "associated" such that the desired functionality is achieved. Hence, any two components combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, the examples, or portions thereof, may implemented as soft or code representations of physical circuitry or of logical representations convertible into physical circuitry, such as in a hardware description language of any appropriate type.

In the claims, the word 'comprising' or 'having' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A clock signal generator for generating a gated clock signal for use with dual-edge triggered circuits, the clock signal generator comprising:
   a first detector that receives an input clock signal, a clock gating signal and a feedback of the gated clock signal for generating, when the clock gating signal is asserted, a first detector output signal that is asserted or de-asserted as a function of disjunction or conjunction respectively of the values that the input clock signal and the gated clock signal had when the clock gating signal transitioned from asserted to de-asserted; and
   a second detector that receives the input clock signal, the clock gating signal and the first detector output signal for generating, when the clock gating signal is de-asserted, as the value of the gated clock signal the value of the input clock signal or the complementary value of the input clock signal as a function of the first detector output signal, and for maintaining, while the clock gating signal is asserted, the value that the gated clock signal had when the clock gating signal transitioned from de-asserted to asserted, wherein the second detector selects as the value of the gated clock signal the value of the input clock signal if the first detector output signal is de-asserted, and the value of the complement of the input clock signal if the first detector output signal is asserted.

2. The clock signal generator of claim 1, wherein the first and second detectors comprise first and second asymmetric Muller C-elements respectively.

3. The clock signal generator of claim 1, wherein the first detector comprises:
   a first logic gate that generates a first intermediate signal that is asserted in the case of disjunction of the values of the input clock signal and the gated clock signal;
   a second logic gate that generates a second intermediate signal that is de-asserted in the case of conjunction of the values of the input clock signal and the gated clock signal;
   a first selector for passing the first or second intermediate signal to the second detector as the first detector output signal while the clock gating signal is asserted; and
   a first latch for maintaining the value the first detector output signal had when the clock gating signal transitioned from asserted to de-asserted.

4. The clock signal generator of claim 3, wherein the first and second logic gates comprise respective XOR and XNOR gates that receive the input clock signal and the gated clock signal, and the complement of the input clock signal and the complement of the gated clock signal.

5. The clock signal generator of claim 3, wherein the second detector comprises:
   a third logic gate that generates a third intermediate signal that is asserted in the case of disjunction of the values of the input clock signal and the first detector output signal;
   a fourth logic gate that generates a fourth intermediate signal that is de-asserted in the case of conjunction of the values of the input clock signal and the first detector output signal;
   a second selector for passing the third or fourth intermediate signal as the value of the gated clock signal when the clock gating signal is de-asserted; and
   a second latch for maintaining the value the second detector output signal had when the clock gating signal transitioned from de-asserted to asserted while the clock gating signal is asserted.

6. A semiconductor device comprising a dual-edge triggered circuit and a clock signal generator for providing a gated clock signal to trigger operation of the dual-edge triggered circuit, the clock signal generator comprising:
   a first detector that receives an input clock signal, a clock gating signal and a feedback of the gated clock signal for generating, when the clock gating signal is asserted, a first detector output signal that is asserted or de-asserted as a function of disjunction or conjunction respectively of the values that the input clock signal and the gated clock signal had when the clock gating signal transitioned from asserted to de-asserted; and
   a second detector that receives the input clock signal, the clock gating signal and the first detector output signal for generating, when the clock gating signal is de-asserted, as the value of the gated clock signal the value of the input clock signal or the complementary value as a function of the first detector output signal, and for maintaining, while the clock gating signal is asserted, the value that the gated clock signal had when the clock gating signal transitioned from de-asserted to asserted, wherein the second detector selects as the value of the gated clock signal the value of the input clock signal if the first detector output signal is de-asserted, and the value of the complement of the input clock signal if the first detector output signal is asserted.

7. The semiconductor device of claim 6, wherein the first and second detectors comprise first and second asymmetric Muller C-elements respectively.

8. The semiconductor device of claim 6, wherein the first detector comprises:
   a first logic gate that generates a first intermediate signal that is asserted in the case of disjunction of the values of the input clock signal and the gated clock signal;
   a second logic gate that generates a second intermediate signal that is de-asserted in the case of conjunction of the values of the input clock signal and the gated clock signal;
   a first selector for passing the first or second intermediate signal to the second detector as the first detector output signal when the clock gating signal is asserted; and
   a first latch for maintaining the value the first detector output signal had when the clock gating signal transitioned from asserted to de-asserted.

9. The semiconductor device of claim 8, wherein the first and second logic gates of the first detector comprise respective XOR and XNOR gates that receive the input clock signal and the gated clock signal and the complement of the input clock signal and the complement of the gated clock signal.

10. The semiconductor device of claim 8, wherein the second detector comprises:
   a third logic gate that generates a third intermediate signal that is asserted in the case of disjunction of the values of the input clock signal and the first detector output signal;
   a fourth logic gate that generates a fourth intermediate signal that is de-asserted in the case of conjunction of the values of the input clock signal and the first detector output signal;
   a second selector for passing the third or fourth intermediate signal as the value of the gated clock signal when the clock gating signal is de-asserted; and
   a second latch for maintaining the value the second detector output signal had when the clock gating signal transitioned from de-asserted to asserted while the clock gating signal is asserted.

11. A method of generating a gated clock signal for use with dual-edge triggered circuit modules, the method comprising:
   a first detector receiving an input clock signal, a clock gating signal and a feedback of the gated clock signal;
   generating, when the clock gating signal is high (asserted), a first detector output signal that is asserted or de-asserted as a function of disjunction or conjunction respectively of the values that the input clock signal and the gated clock signal had when the clock gating signal transitioned from asserted to de-asserted;
   a second detector receiving the input clock signal, the clock gating signal and the first detector output signal;
   generating, when the clock gating signal is de-asserted, as the value of the gated clock signal the value of the input clock signal or the complementary value of the input clock signal as a function of the first detector output signal; and maintaining, while the clock gating signal is asserted, the value that the gated clock signal had when the clock gating signal transitioned from de-asserted to asserted, wherein the value of the gated clock signal is selected as the value of the input clock signal if the first detector output signal is de-asserted, and the value of the complement of the input clock signal if the first detector output signal is asserted.

12. The method of claim 11, wherein first and second asymmetric Muller C-elements are used to generate the first detector output signal and the gated clock signal respectively.

13. The method of claim 11, further comprising:
generating a first intermediate signal that is asserted in the case of disjunction of the values of the input clock signal and the gated clock signal;
generating a second intermediate signal that is de-asserted in the case of conjunction of the values of the input clock signal and the gated clock signal;
passing the first or second intermediate signal as the first detector output signal when the clock gating signal is asserted; and
maintaining the value the first detector output signal had when the clock gating signal transitioned from asserted to de-asserted.

14. The method of claim 13, wherein the first and second intermediate signals are produced using detector logic gates comprising respective XOR and XNOR gates that receive the input clock signal and the gated clock signal and the complement of the input clock signal and the complement of the gated clock signal.

15. The method of claim 11, further comprising:
generating a third intermediate signal that is asserted in the case of disjunction of the values of the input clock signal and the first detector output signal;
generating a fourth intermediate signal that is de-asserted in the case of conjunction of the values of the input clock signal and the first detector output signal;
passing the third or fourth intermediate signal as the value of the gated clock signal when the clock gating signal is de-asserted; and
maintaining the value the second detector output signal had when the clock gating signal transitioned from de-asserted to asserted while the clock gating signal is asserted.

* * * * *